US009672895B2

United States Patent
Antonyan

(10) Patent No.: US 9,672,895 B2
(45) Date of Patent: Jun. 6, 2017

(54) SENSE AMPLIFIER, SEMICONDUCTOR MEMORY DEVICE USING THEREOF AND READ METHOD THEREOF

(71) Applicant: Artur Antonyan, Suwon-si (KR)

(72) Inventor: Artur Antonyan, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 15/132,258

(22) Filed: Apr. 19, 2016

(65) Prior Publication Data

US 2016/0232963 A1  Aug. 11, 2016

Related U.S. Application Data

(63) Continuation of application No. 14/518,485, filed on Oct. 20, 2014, now Pat. No. 9,343,138.

(30) Foreign Application Priority Data

Dec. 16, 2013 (KR) .......................... 10-2013-0156513

(51) Int. Cl.
G11C 7/06 (2006.01)
G11C 11/4091 (2006.01)
G11C 11/4099 (2006.01)
G11C 11/408 (2006.01)

(52) U.S. Cl.
CPC ...... *G11C 11/4091* (2013.01); *G11C 11/4087* (2013.01); *G11C 11/4099* (2013.01); *G11C 2207/002* (2013.01)

(58) Field of Classification Search
None
See application file for complete search history.

(56) References Cited

U.S. PATENT DOCUMENTS

| | | | |
|---|---|---|---|
| 5,652,728 A | 7/1997 | Hosotani et al. |
| 5,812,476 A | 9/1998 | Segawa |
| 5,943,270 A | 8/1999 | Borkar |
| 5,995,433 A | 11/1999 | Liao |
| 6,016,268 A | 1/2000 | Worley |

(Continued)

FOREIGN PATENT DOCUMENTS

JP  11-162164 A  6/1999

OTHER PUBLICATIONS

Ki Chul Chun et al., "A 1.1V, 667MHz Random Cycle, Asymmetric 2T Gain Cell Embedded DRAM with a 99.9 Percentile Retention Time of 110μsec", 2010 Symposium on VLSI Circuits/Technical Digest of Technical Papers, pp. 191-192.

(Continued)

*Primary Examiner* — Son Dinh
*Assistant Examiner* — Uyen B Tran
(74) *Attorney, Agent, or Firm* — Sughrue Mion, PLLC

(57) ABSTRACT

A sense amplifier is provided which includes a first load supplied with a selection cell current from a read bit line connected to a selected memory cell; a second load supplied with a reference current from a reference read bit line connected to a reference cell, a resistance value of the second load being different from a resistance value of the first load; and a sensing unit configured to correct a level of the reference current based on a resistance ratio of the first and second loads and to compare the selection cell current and the corrected reference current.

15 Claims, 14 Drawing Sheets

(56) References Cited

U.S. PATENT DOCUMENTS

| | | | |
|---|---|---|---|
| 6,118,701 A * | 9/2000 | Uekubo | G11C 11/5642 365/185.2 |
| 6,314,017 B1 | 11/2001 | Emori et al. | |
| 6,671,210 B2 | 12/2003 | Watanabe et al. | |
| 6,680,864 B2 | 1/2004 | Noble | |
| 6,831,866 B1 | 12/2004 | Kirihata | |
| 6,949,782 B2 | 9/2005 | Atwood et al. | |
| 7,016,211 B2 | 3/2006 | Park et al. | |
| 7,123,500 B2 | 10/2006 | Ye et al. | |
| 7,151,690 B2 | 12/2006 | Forbes | |
| 7,391,667 B2 | 6/2008 | Atwood et al. | |
| 7,440,334 B2 | 10/2008 | Barth et al. | |
| 7,459,743 B2 | 12/2008 | Mandelman et al. | |
| 7,468,901 B2 | 12/2008 | Kameshiro et al. | |
| 7,859,889 B2 | 12/2010 | Kameshiro et al. | |
| 2001/0030338 A1 | 10/2001 | Noble | |
| 2003/0026156 A1 | 2/2003 | Watanabe et al. | |
| 2004/0164326 A1 | 8/2004 | Atwood et al. | |
| 2005/0146921 A1 | 7/2005 | Ye et al. | |
| 2005/0152199 A1 | 7/2005 | Park et al. | |
| 2006/0028859 A1 | 2/2006 | Forbes | |
| 2006/0077737 A1 * | 4/2006 | Ooishi | G11C 11/16 365/203 |
| 2006/0164876 A1 | 7/2006 | Barth et al. | |
| 2006/0227648 A1 | 10/2006 | Kameshiro et al. | |
| 2006/0274573 A1 * | 12/2006 | Iwata | G11C 11/16 365/158 |
| 2007/0047293 A1 | 3/2007 | Mandelman et al. | |
| 2007/0081380 A1 | 4/2007 | Atwood et al. | |
| 2008/0158935 A1 | 7/2008 | Taguchi | |
| 2008/0285325 A1 | 11/2008 | Kameshiro et al. | |
| 2010/0118581 A1 * | 5/2010 | Okayama | G11C 11/16 365/51 |
| 2012/0044755 A1 * | 2/2012 | Kim | G11C 29/24 365/171 |
| 2012/0087177 A1 | 4/2012 | Kim et al. | |
| 2012/0287700 A1 | 11/2012 | Takemura | |

OTHER PUBLICATIONS

Ki Chul Chun et al., "A 667 MHz Logic-Compatible Embedded DRAM Featuring an Asymmetric 2T Gain Cell for High Speed On-Die Caches", IEEE Journal of Solid-State Circuits, vol. 47, No. 2, Feb. 2012, pp. 547-559.

Ki Chul Chun et al., "A 2T1C Embedded DRAM Macro With No Boosted Supplies Featuring a 7T SRAM Based Repair and a Cell Storage Monitor", IEEE Journal of Solid-State Circuits, vol. 47, No. 10, Oct. 2012, pp. 2517-2526.

* cited by examiner

SENSE AMPLIFIER, SEMICONDUCTOR MEMORY DEVICE USING THEREOF AND READ METHOD THEREOF

CROSS-REFERENCE TO RELATED APPLICATIONS

This application is a Continuation of U.S. patent application Ser. No. 14/518,485, filed on Oct. 20, 2014, which claims priority from Korean Patent Application No. 10-2013-0156513, filed on Dec. 16, 2013, the entire contents of both of which are hereby incorporated by reference.

BACKGROUND

1. Field

Devices, apparatuses, methods, and articles of manufacture consistent with the present disclosure relate to a sense amplifier, a semiconductor memory device including the sense amplifier, and a read method thereof, and more particularly, to a sense amplifier having an unbalanced structure, a semiconductor memory device including the sense amplifier, and a read method thereof.

2. Description of Related Art

A semiconductor memory device is a volatile memory device or a nonvolatile memory device. The volatile memory device has fast reading and writing speeds, while the volatile memory device loses data stored therein at power-off. On the other hand, the nonvolatile memory device retains data stored therein even at power-off. For this reason, the nonvolatile memory device is used to store data to be retained regardless of whether a power is supplied to the nonvolatile memory device.

A semiconductor memory device such as a dynamic random access memory (hereinafter, referred to as DRAM) utilizes a sense amplifier to read data. As a storage density of the semiconductor memory device increases, an operation voltage of the semiconductor memory device gradually decreases.

SUMMARY

It is an aspect to provide a sense amplifier having an unbalanced structure for improvement of sensing margin, a semiconductor memory device including the sense amplifier, and a read method thereof.

According to an aspect of an exemplary embodiment, there is provided a sense amplifier including a first load supplied with a selection cell current from a read bit line connected to a selected memory cell; a second load supplied with a reference current from a reference read bit line connected to a reference cell, a resistance value of the second load being different from a resistance value of the first load; and a sensing unit configured to correct a level of the reference current based on a resistance ratio of the first and second loads and to compare the selection cell current and the corrected reference current.

In some exemplary embodiments, the reference read bit line is connected to a plurality of reference cells sharing the reference read bit line.

In some exemplary embodiments, the reference cells are connected in parallel and the reference cell current from the reference read bit line corresponds to a sum of currents respectively passing through the reference cells.

In some exemplary embodiments, the reference cells comprise a first reference cell and a second reference cell, and the first reference cell is programmed to a first program state for storing a first bit value and the second reference cell is programmed to a second program state for storing a second bit value.

In some exemplary embodiments, the first bit value is data '1' and the second bit value is data '0'.

In some exemplary embodiments, a resistance ratio of the first and second loads is 2:1.

In some exemplary embodiments, the first and second loads comprise MOS transistors.

In some exemplary embodiments, the first load is a first transistor that has a channel connected between an operation voltage source and the read bit line.

In some exemplary embodiments, the second load comprises second and third transistors, the channels of the second and third transistors being connected between the operation voltage source and the reference read bit line.

In some exemplary embodiments, the first to third transistors have the same physical characteristic.

In some exemplary embodiments, the sense amplifier further comprises an output unit configured to sink the selection cell current and the reference current, and the output unit is connected between the sensing unit and a ground voltage.

In some exemplary embodiments, the output unit comprises at least one diode comprising a MOS transistor.

According to another aspect of an exemplary embodiment, there is provided a sense amplifier including a first load supplied with a first cell current from a first read bit line connected to a first memory cell array; a second load supplied with a second cell current from a second read bit line connected to a second memory cell array; and a sensing unit configured to correct a level of a reference current based on a resistance ratio of the first and second loads and to compare the selection cell current and the corrected reference current, wherein resistance values of the first and second loads are varied in response to a control signal.

In exemplary embodiments, the first and second loads comprise MOS transistors.

In exemplary embodiments, the first load comprises first and second transistors, the channels of the first and second transistors being connected between an operation voltage source and the first read bit line, and the first transistor is turned on in response to the control signal.

In some exemplary embodiments, the second load comprises third and fourth transistors, the channels of the third and fourth transistors being connected between the operation voltage source and the second read bit line, and the fourth transistor is turned on in response to the control signal.

According to an aspect of an exemplary embodiment, there is provided a semiconductor memory device including a first memory cell array having a first main cell area and a first reference cell area sharing a word line with the first main cell area; a second memory cell array having a second main cell area and a second reference cell area sharing a word line with the second main cell area; a sense amplifier connected to the first memory cell array via a first bit line to be supplied with a first cell current, connected to the second memory cell array via a second bit line to be supplied with a second cell current, and configured to sense data stored in the first and second main cell areas using the first and second reference cell areas, respectively; and a selector configured to provide the sense amplifier with a control signal indicating a location of a selected memory cell, wherein the sense amplifier corrects levels of the first and second cell currents in response to the control signal, compares the corrected first and second cell currents, and senses data stored in the first and second main cell areas based on the comparison result.

In some exemplary embodiments, when a memory cell of the first memory cell array is selected, the sense amplifier is connected to the first main cell area and the second reference cell area to sense data stored in the first main cell area using the second reference cell area.

In some exemplary embodiments, the second reference cell area comprises first and second reference cells sharing the second bit line, the first reference cell is programmed to a first program state for storing a first bit value, and the second reference cell is programmed to a second program state for storing a second bit value.

In some exemplary embodiments, the first and second reference cell areas are set in response to a signal provided from an external device.

In some exemplary embodiments, locations of the first and second reference cell areas are fixed within the first and second memory cell arrays, respectively.

In some exemplary embodiments, the selector generates the control signal in response to an address provided from an external device.

In some exemplary embodiments, the semiconductor memory device further comprises a row decoder configured to decode a row address provided from the external device, and the selector generates the control signal based on the row address.

In some exemplary embodiments, the first and second memory cell arrays comprise a plurality of memory cells each having a gain cell structure.

According to an aspect of an exemplary embodiment, there is provided a read method of a semiconductor memory device, the method including storing first and second program states using the same cells as a memory cell storing data; and sensing data stored in a selected memory cell using currents provided from transistors in which the first and second program states are stored, at a read operation.

In some exemplary embodiments, the currents provided from the transistors in which the first and second program states are stored are corrected as a reference current within a sense amplifier having an unbalanced structure.

BRIEF DESCRIPTION OF THE FIGURES

The above and other aspects will become apparent from the following description with reference to the following figures, wherein like reference numerals refer to like parts throughout the various figures unless otherwise specified, and wherein.

DETAILED DESCRIPTION

Figure 1:
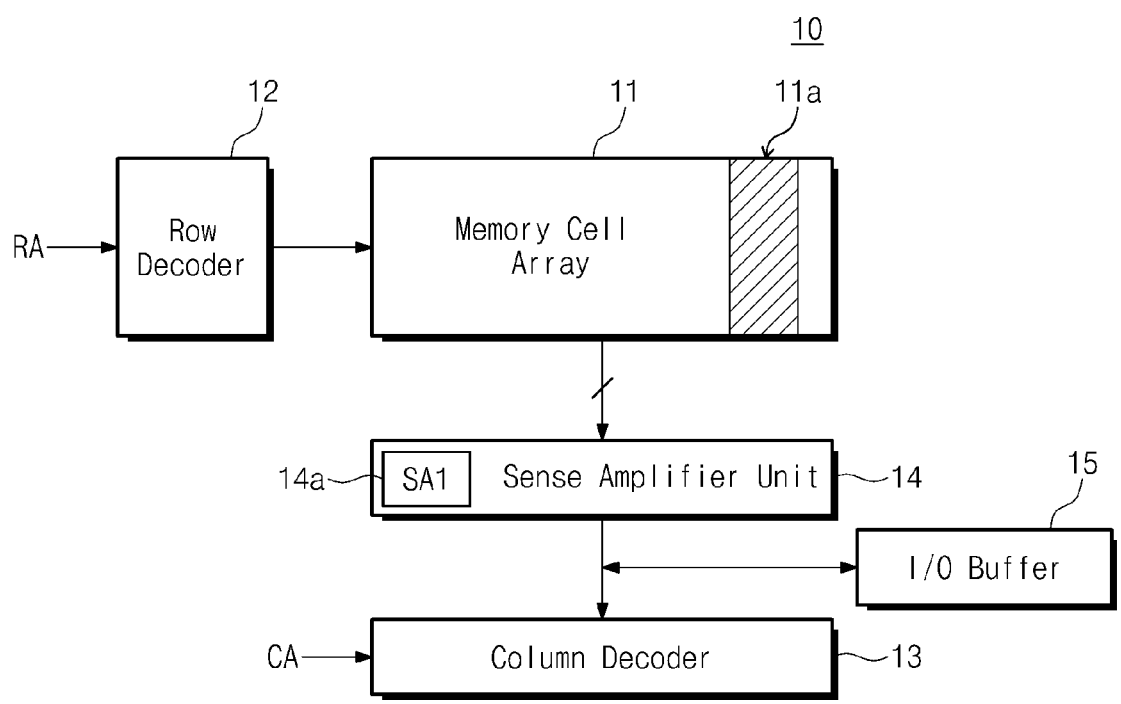
FIG. 1 is a block diagram schematically illustrating a semiconductor memory device according to an exemplary embodiment.

Exemplary embodiments will be described in detail with reference to the accompanying drawings. The inventive concept, however, may be embodied in various different forms, and should not be construed as being limited only to the illustrated exemplary embodiments. Rather, these exemplary embodiments are provided as examples so that this disclosure will be thorough and complete, and will fully convey the inventive concept to those skilled in the art. Accordingly, known processes, elements, and techniques are not described with respect to some of the exemplary embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a semiconductor memory device according to an exemplary embodiment. Referring to FIG. 1, a semiconductor memory device 10 comprises a memory cell array 11, a row decoder 12, a column decoder 13, a sense amplifier unit 14, and an input/output (I/O) buffer 15. A sensing margin of the semiconductor memory device 10 may be improved by using a plurality of reference cells programmed to have different states at a read operation.

The memory cell array 11 comprises a plurality of memory cells that are arranged at intersection of a plurality of word lines and a plurality of bit lines. Each memory cell may be a volatile memory cell that includes at least an access transistor and a storage capacitor. Alternatively, each memory cell may be a gain cell including a plurality of transistors. A structure of a memory cell will be more fully described with reference to FIG. 2.

The memory cell array 11 comprises a reference cell area 11a. The reference cell area 11a comprises a plurality of reference cells. The reference cells are used to generate a reference voltage or a reference current for reading data stored in the memory cell array 11. The reference cells are configured the same as the memory cells of the memory cell array 11. For example, a reference cell may be a volatile memory cell including a storage capacitor. Or, a reference cell may be a gain cell including a plurality of transistors.

A location of the reference cell area 11a may be fixed within the memory cell array 11. Alternatively, a location of the reference cell array 11a may be variable according to a control of an external device or the semiconductor memory device 10.

In some exemplary embodiments, the reference cell area 11a may include two or more reference cells that are programmed to have different program states. The two or more reference cells programmed to have different program states are connected in parallel with each other, and a pair of reference cells may be used to read stored in a selected memory cell. The reference cell will be more fully described with reference to FIG. 3.

The row decoder 12 decodes a row address RA provided from an external device. The row address RA may be provided through an address buffer. The row decoder 12 selects a row of the memory cell array 11 using the decoded row address.

The column decoder 13 decodes a column address CA provided from the external device. The column address may be provided through the address buffer from the external device. The column decoder 13 select a column of the memory cell array 11 using the decoded column address.

The sense amplifier unit 14 senses and amplifies a voltage or a current developed on a bit line to read data stored in a selected memory cell. The sense amplifier unit 14 may include a plurality of sense amplifiers respectively connected to the bit lines. In FIG. 1, there is exemplarily illustrated a first sense amplifier SA1 14a.

The first sense amplifier SA1 14a may be connected to a selected memory cell and two or more reference cells. The first sense amplifier SA1 14a senses data stored in a selected memory cell using a reference voltage or current that is generated using two or more reference cells. The first sense amplifier SA1 14a may have an unbalanced structure for the above-described operation. Since the first sense amplifier SA1 14a senses stored data using a reference voltage or current finely controlled using a plurality of reference cells, a sensing margin of the semiconductor memory device 10 may be improved.

The input/output (I/O) buffer 15 outputs data read from the memory cell array 11, and provides program data provided from the external device to the memory cell array 11.

The semiconductor memory device 10 generates a reference voltage or current using a plurality of reference cells that are programmed to have different program states. In the semiconductor memory device 10, the sense amplifier unit 14 having an unbalanced structure reads data stored in a selected memory cell using the reference voltage or current thus generated. Since the semiconductor memory device 10 senses stored data using a reference voltage or current finely controlled using a plurality of reference cells, sensing margin of the semiconductor memory device 10 may be improved.

Figure 2:
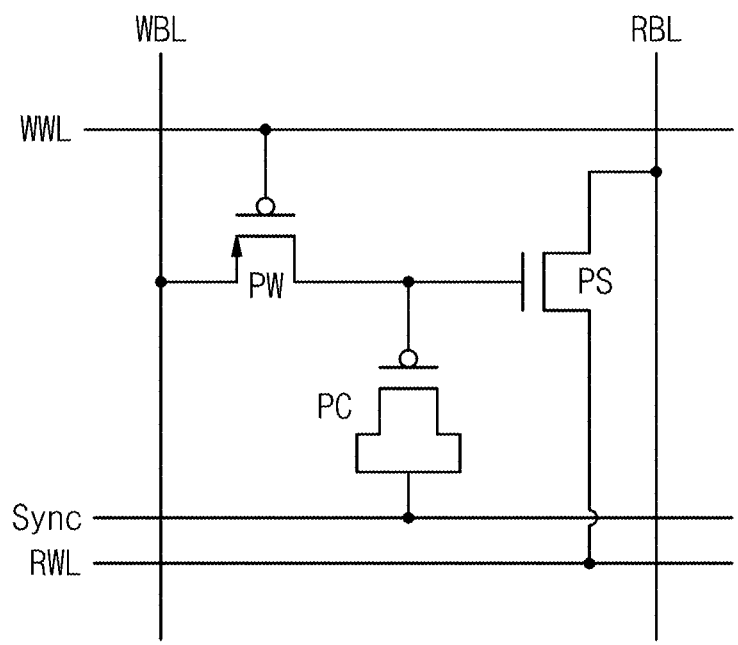
FIG. 2 is a circuit diagram schematically illustrating a memory cell of a memory cell array of the semiconductor memory device shown in FIG. 1, according to an exemplary embodiment.
Figure 3:
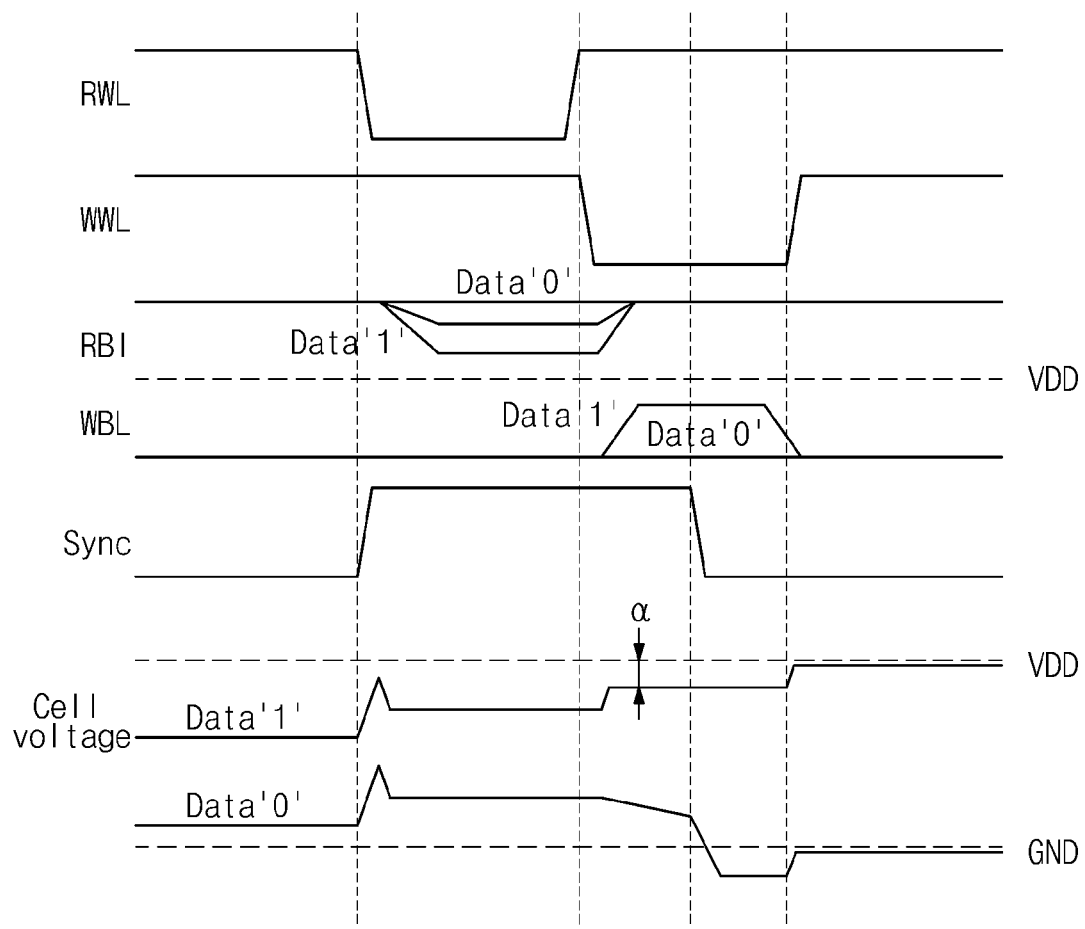
FIG. 3 is a timing diagram schematically illustrating a sensing operation of the memory cell shown in FIG. 2, according to an exemplary embodiment.

FIG. 2 is a circuit diagram schematically illustrating a memory cell of the memory cell array shown in FIG. 1, according to an exemplary embodiment. FIG. 3 is a timing diagram schematically illustrating a sensing operation on the memory cell shown in FIG. 2, according to an exemplary embodiment. In FIG. 2, there is illustrated a memory cell having a 2T-2C gain cell structure. However, the inventive concept is not limited thereto. For example, a memory cell may be implemented to have various structures including a 3T gain cell structure.

A memory cell having a gain cell structure stores data using electrical charges. An electrical charge in the memory cell need not be coupled directly with a bit line, and may be stored on a gate electrode of a sensing transistor PS. Since the memory cell having the gain cell structure uses a lesser amount of electrical charge to store data, the memory cell having the gain cell structure operates quickly with less storage capacity.

Referring to FIG. 2, the memory cell comprises a write transistor PW, a sensing transistor PS, and a coupling capacitor PC. The memory cell is connected to a synchronization line Sync, a write bit line WBL, a write word line WWL, a read bit line RBL, and a read word line RWL.

A channel of the sensing transistor PS is connected between the read bit line RBL and the read word line RWL. Electrical charge may be stored on a gate electrode of the sensing transistor PS. The memory cell may store data using a gate voltage of the sensing transistor PS. Hereinafter, the gate voltage of the sensing transistor PS is referred to as a cell voltage. A ground voltage is applied to the synchronization line Sync during a time when stored data is held.

Referring to FIG. 3, during a data read operation, a ground voltage VSS is applied to the read word line RWL connected to a selected memory cell. On the other hand, a read word line connected to an unselected memory cell may be pre-charged to an operation voltage VDD.

During a data read operation, the synchronization line Sync is pre-charged to an operation voltage VDD. If the synchronization line Sync is pre-charged, the cell voltage rises by the coupling capacitor PC that is connected in series between the gate electrode of the sensing transistor PS and the synchronization line Sync, so that read performance is stimulated.

As the gate voltage of the sensing transistor PS is increased, the sensing transistor PS is turned on. At this time, a current that flows from the read bit line RBL pre-charged to the pre-charge voltage to the read word line RWL is generated. A sense amplifier unit 14 (refer to FIG. 1) senses data stored in the memory cell based on a voltage or current of the read bit line RBL.

Meanwhile, after the sensing operation is performed, a recovery program operation may be performed. The recovery program operation on the gate electrode of the sensing transistor PS is performed using the write transistor PW. A channel of the write transistor PW is connected between the write bit line WBL and the gate electrode of the sensing transistor PS, and a gate electrode thereof is connected to the write word line WWL.

During the recovery program operation, the write word line WWL connected to a plurality of memory cells is grounded. As the write word line WWL is grounded, the write transistor PW is turned on. At this time, the write bit line WBL and the gate electrode of the sensing transistor PS are electrically connected. Under this condition, the recovery program operation is performed using a voltage pre-charged on the write bit line WBL. A voltage slightly lower than an operation voltage VDD is applied to the write bit line WBL to store a first bit value, for example, data '1' in a memory cell to be recovered. On the other hand, a ground voltage is applied to the write bit line WBL to store a second bit value, for example, data '0' in a memory cell to be recovered.

After the recovery program operation is performed, a ground voltage is applied to the synchronization line Sync. In the event that the second bit value, for example, data '0' is stored in a memory cell, a cell voltage decreases by the coupling capacitor PC. Afterwards, the operation voltage VDD is applied to the write word line WWL, and the cell voltage rises by a voltage α by the coupling. The voltage α may be predetermined.

As described with reference to FIGS. 2 and 3, a memory cell with a gain cell structure uses a lesser amount of electrical charge to store data, so that the memory cell with a gain cell structure operates quickly with less storage capacity. However, since the gain cell structured memory cell has a low operation voltage, a reference voltage or current used at a read operation is finely controlled to secure a sensing margin.

Figure 4:
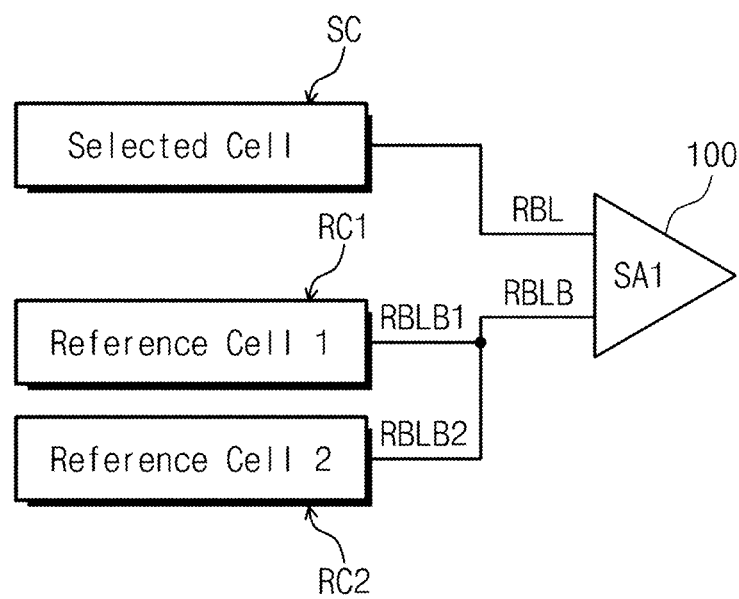
FIG. 4 is a block diagram schematically illustrating a first sense amplifier of the semiconductor memory device shown in FIG. 1, according to an exemplary embodiment.

FIG. 4 is a block diagram schematically illustrating a first sense amplifier shown in FIG. 1, according to an exemplary embodiment. Referring to FIG. 4, a first sense amplifier SA1 100 is connected to a selected cell SC through a read bit line RBL. Also, the first sense amplifier 100 is connected to first and second reference cells RC1 and RC2 through a reference read bit line RBLB. However, the inventive concept is not limited thereto. For example, the number of reference cells connected to the first sense amplifier 100 is not limited to two, and the number of reference cells connected may be greater than two.

In some exemplary embodiments, the first sense amplifier SA1 100 senses data stored in the selected cell SC by comparing a current flowing through the read bit line RBL and a reference current flowing through the reference read bit line RBLB. However, the inventive concept is not limited thereto. For example, the first sense amplifier SA1 100 senses data stored in the selected cell SC by comparing a voltage of the read bit line RBL and a reference voltage on the reference read bit line RBLB.

The first and second reference cells RC1 and RC2 are cells programmed to generate a reference current. The first and second reference cells RC1 and RC2 are included in a reference cell area 11a (refer to FIG. 1).

In some exemplary embodiments, the first reference cell RC1 is programmed to a first program state. A reference cell having the first program state stores a first bit value. The first bit value may be data '1'. The second reference cell RC2 is programmed to a second program state. A reference cell having the second program state stores a second bit value. The second bit value may be data '0'.

The first and second reference cells RC1 and RC2 are connected in parallel with each other. Thus, a current flowing through the reference read bit line RBLB is decided by a sum of currents respectively flowing through first and second reference read bit lines RBLB1 and RBLB2.

The first sense amplifier SA1 100 senses data stored in the selected cell SC by comparing a current flowing through the read bit line RBL and a reference current flowing through the reference read bit line RBLB. At this time, the first sense amplifier 100 performs a comparison between a current flowing via the read bit line RBL, and a condition on the reference read bit line RBLB in which the condition is weighted.

In some exemplary embodiments, the first sense amplifier SA1 100 is configured such that a load resistance on the read bit line RBL is two times larger than a load resistance on the reference read bit line RBLB. In some exemplary embodiments, the first sense amplifier 100 compares a current flowing via the read bit line RBL and an intermediate value of currents respectively flowing via the first and second reference read bit lines RBLB1 and RBLB2 with a load resistance being weighted.

During a read operation, the first sense amplifier 100 uses reference currents generated from a plurality of reference cells with a condition on the reference read bit line RBLB being weighted. Since the first sense amplifier 100 finely controls a reference current as compared with the case that a reference current is generated using a single reference cell, the reliability of a semiconductor memory device 10 (refer to FIG.) is secured and increased.

Figure 5:
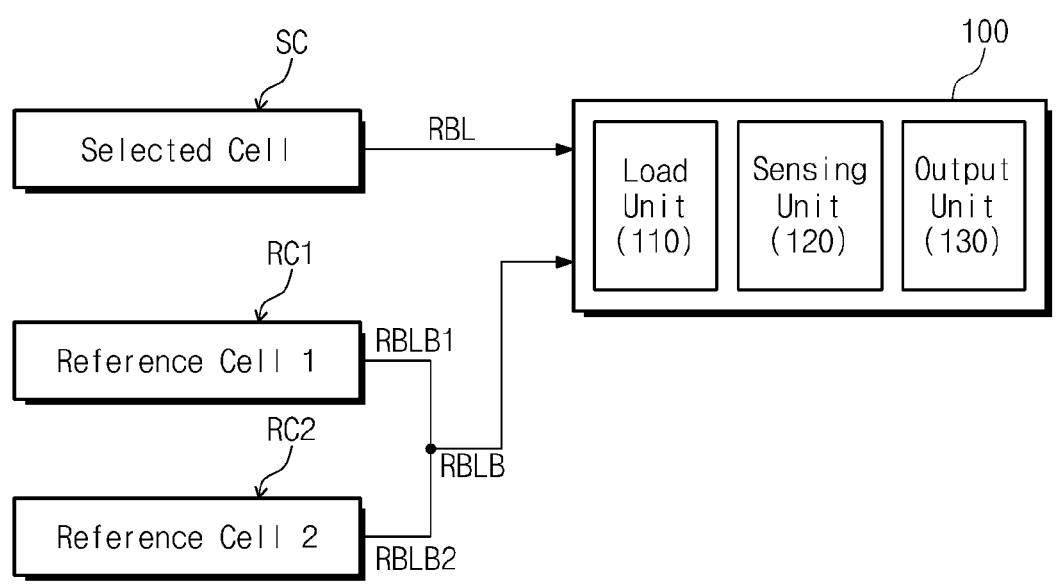
FIG. 5 is a block diagram schematically illustrating the first sense amplifier shown in FIG. 4 in more detail, according to an exemplary embodiment.

FIG. 5 is a block diagram schematically illustrating a first sense amplifier shown in FIG. 4 in more detail, according to an exemplary embodiment. Referring to FIG. 5, a first sense amplifier 100 comprises a load unit 110, a sensing unit 120, and an output unit 130. The first sense amplifier 100 senses data stored in a selected cell SC by comparing a current (hereinafter, referred to as a selection cell current) flowing through a read bit line RBL and a reference current flowing through a reference read bit line RBLB. The first sense amplifier 100 performs a comparison between a current flowing via the read bit line RBL using the load unit 110 and a condition on the reference read bit line RBLB, the condition being weighted.

The load unit 110 comprises a main load connected to the read bit line RBL and a reference load connected to the reference read bit line RBLB. The load unit 110 has an unbalanced structure in which a resistance value of the main load is different from that of the reference load. The main load and reference load of the load unit 110 may be formed of one or more transistors. In some exemplary embodiments, the one or more transistors forming the load unit 110 may include NMOS transistors.

In some exemplary embodiments, the size of the main load is two times larger than that of the reference load. However, it will be appreciated that the size of the main load may be a different multiplier than two times larger than the size of the reference load. The first sense amplifier 100 compares a current flowing via the read bit line RBL and an intermediate value of currents respectively flowing via first and second reference read bit lines RBLB1 and RBLB2 with a weight being provided between the main load and the reference load.

The sensing unit 120 is connected to the load unit 110. The sensing unit 120 may include a latch formed of transistors. The sensing unit 120 senses a voltage drop generated by the main load and the selection cell current, and a voltage drop generated by the reference load and the reference current, and amplifies the sensed difference.

The output unit 130 is connected between the sensing unit 120 and ground. The output unit 130 may comprise a diode formed of a transistor. The output unit 130 connects the sensing unit 120 to ground voltage such that the selection cell current and the reference current respectively supplied to the read bit line RBL and the reference read bit line RBLB are sunken.

The first sense amplifier 100 compares a current flowing via the read bit line RBL using the load unit 110 with a condition on the reference read bit line RBLB, the condition being weighted. Since the first sense amplifier 100 finely controls a reference current as compared with the case that a reference current is generated using a single reference cell, the reliability of a semiconductor memory device 10 (refer to FIG.) is secured and increased.

Figure 6:
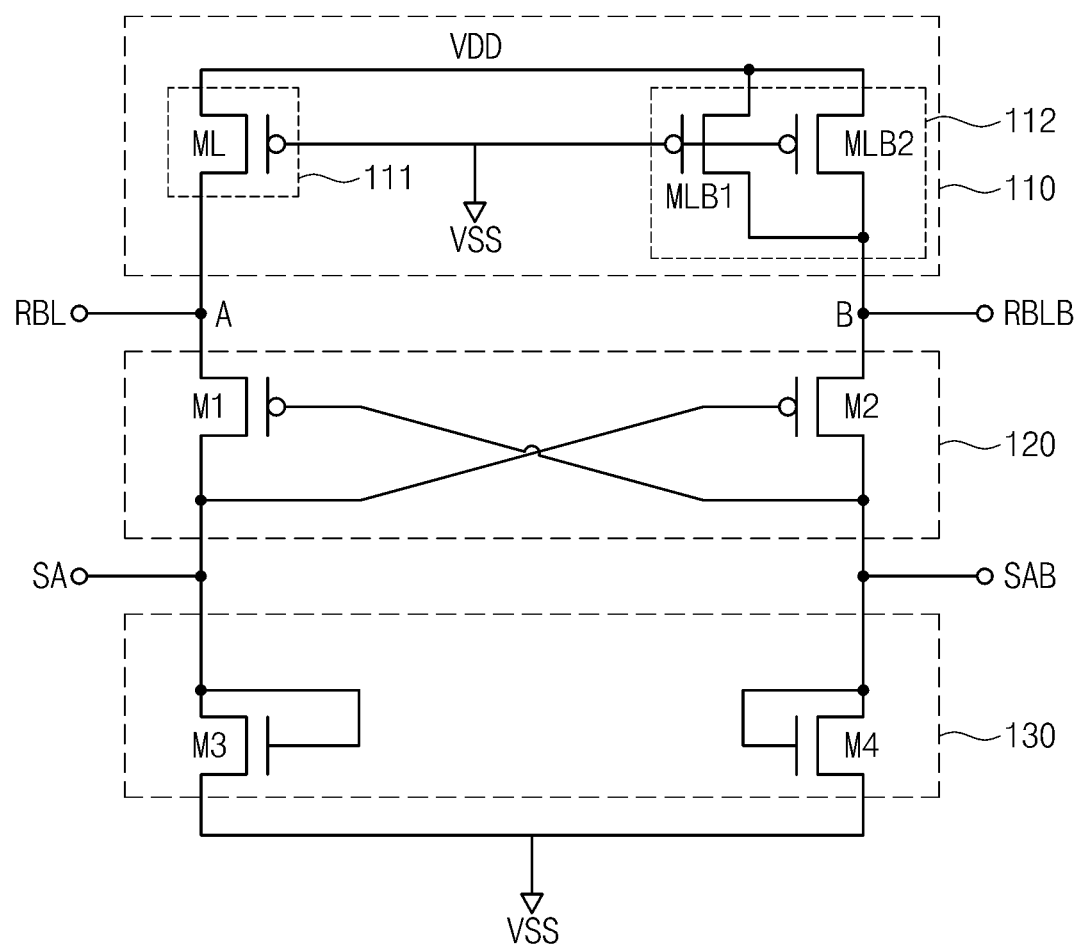
FIG. 6 is a circuit diagram schematically illustrating the first sense amplifier shown in FIG. 5, according to an exemplary embodiment.

FIG. 6 is a circuit diagram schematically illustrating a first sense amplifier shown in FIG. 5 in more detail, according to an exemplary embodiment. Referring to FIG. 6, a first sense amplifier 100 comprises a load unit 110, a sensing unit 120, and an output unit 130.

The load unit 110 comprises a main load 111 and a reference load 112.

The main load 111 is connected between a node A connected to a read bit line RBL and an operation voltage source VDD. The read bit line RBL is connected to a selected cell, and is supplied with a selection cell current at a sensing operation. In some exemplary embodiments, the main load 111 is formed of a load transistor ML. A channel of the load transistor ML is connected between the node A and the operation voltage source VDD. A gate of the load transistor ML is connected to a ground voltage VSS.

The reference load 112 is connected between a node B connected to a reference read bit line RBLB and the operation voltage source VDD. The reference read bit line RBLB is connected to a plurality of reference cells, and is supplied with a reference current at a sensing operation. The reference cells may be programmed to different program states. In some exemplary embodiments, the reference load 112 is formed of first and second reference load transistors MLB1 and MLB2 connected in parallel with each other. The first and second reference load transistors MLB1 and MLB2 may have the same physical characteristic as that of the load transistor ML. In some exemplary embodiments, the first and second reference load transistors MLB1 and MLB2 may have the same transistor size as that of the load transistor ML.

Channels of the first and second reference load transistors MLB1 and MLB2 are connected in series between the node B and the operation voltage source VDD. Gates of the first and second reference load transistors MLB1 and MLB2 are connected to a ground voltage VSS. With this structure of the reference load 112, a resistance value of the reference load 112 seen from the reference read bit line RBLB is half the resistance value of the main load 111 seen from the read bit line RBL.

The sensing unit 120 converts a difference between the selection cell current and the reference current into a voltage difference. In particular, the sensing unit 120 senses a voltage drop generated by the selection cell current and the main load 111, and a voltage drop generated by the reference current and the reference load 112, and amplifies the sensed difference. In some exemplary embodiments, the sensing unit 120 comprises first and second transistors M1 and M2 that are cross coupled PMOS transistors.

A channel of the first transistor M1 is connected between the node A and a positive output node SA. A gate of the first transistor M1 is connected to a negative output node SAB. A channel of the second transistor M2 is connected between the node B and the negative output node SAB. A gate of the second transistor M2 is connected to the positive output node SA.

A level of current flowing from the node A to the first transistor M1 is decided by a selection cell current flowing via the read bit line RBL and the size of the main load 111. A level of current flowing from the node B to the second transistor M2 is decided by a reference current flowing via the reference read bit line RBLB and the size of the reference load 112.

As a voltage of the positive output node SA increases according to an increase in the current flowing from the node A to the first transistor M1, a gate voltage of the second transistor M2 increases. In this case, a current flowing via a channel of the second transistor M2 decreases. If a current flowing via a channel of the second transistor M2 decreases, a voltage of the negative output node SAB decreases. The sensing unit 120 outputs a voltage difference between the positive output node SA and the negative output node SAB as a differential output.

The output unit 130 connects the sensing unit 120 to a ground voltage VSS such that the selection cell current and the reference current are sunken. The output unit 130 comprises at least one diode. In some exemplary embodiments, the at least one diode comprises third and fourth transistors M3 and M4.

A channel of the third transistor M3 is connected between the positive output node SA and the ground voltage VSS. Since a gate of the third transistor M3 is connected to the positive output node SA, the third transistor M3 acts as a diode. A channel of the fourth transistor M4 is connected between the negative output node SAB and the ground voltage VSS. Since a gate of the fourth transistor M4 is connected to the negative output node SAB, the fourth transistor M4 acts as a diode.

The first sense amplifier 100 comprises the main load 111 connected to a selected cell and the reference load 112 connected to a plurality of reference cells. Using the main and reference loads 111 and 112, the first sense amplifier 100 performs comparison between a current flowing via the read bit line RBL and a condition on the reference read bit line RBLB, the condition being weighted. Since the first sense amplifier 100 compares a reference current generated by a plurality of reference cells and a selection cell current generated by a selected cell, the reliability of a semiconductor memory device 10 (refer to FIG. 1) is secured and increased.

Figure 7:
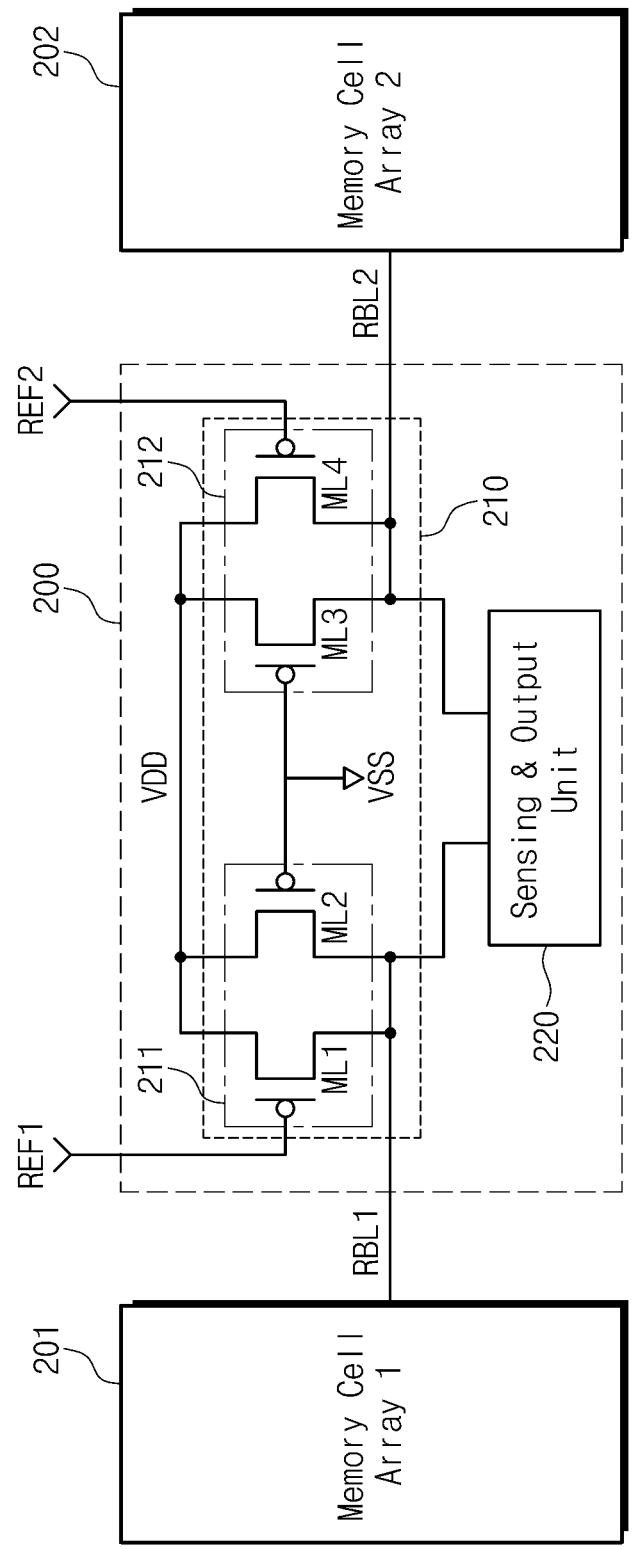
FIG. 7 is a block diagram schematically illustrating an exemplary embodiment where a sense amplifier according to an exemplary embodiment is connected to a memory cell array.

FIG. 7 is a block diagram schematically illustrating an exemplary embodiment where a sense amplifier according to an exemplary embodiment is connected to a memory cell array. Referring to FIG. 7, a sense amplifier 200 is connected to a first memory cell array 201 and a second memory cell array 202.

The sense amplifier 200 uses reference cells included in the first and second memory cell arrays 201 and 202 in a complementary manner. In some exemplary embodiments, the sense amplifier 200 reads data stored in a selected memory cell of the first memory cell array 201 using reference cells included in the second memory cell array 202. This will be more fully described with reference to the accompanying drawings.

Each of the first and second memory cell arrays 201 and 202 may include a plurality of memory cells arranged at intersections of a plurality of word lines and a plurality of bit lines. Each memory cell may be a volatile memory cell including at least an access transistor and a storage capacitor. Alternatively, each memory cell may be a gain cell including a plurality of transistors.

Each of the first and second memory cell arrays 201 and 202 may comprise a reference cell area. A location of each of the reference cell areas of the first and second memory cell arrays 201 and 202 may be fixed within a corresponding to memory cell array. Alternatively, a location of each of the reference cell areas of the first and second memory cell arrays 201 and 202 may be varied by a control of an external device or a semiconductor memory device.

In some exemplary embodiments, each reference cell area may include two or more reference cells that are programmed to have different program states. The two or more reference cells programmed to have different program states are connected in parallel with each other, and a pair of reference cells may be used to read stored in a selected memory cell.

The sense amplifier 200 senses and amplifies a voltage or a current developed on a bit line to read data stored in a selected memory cell of each of the first and second memory cell arrays 201 and 202.

The sense amplifier 200 reads data stored in a selected memory cell of the first memory cell array 201 using reference cells included in the second memory cell array 202. Likewise, the sense amplifier 200 reads data stored in a selected memory cell of the second memory cell array 202 using reference cells included in the first memory cell array 201.

The sense amplifier 200 comprises a load selection unit 210 and a sensing and output unit 220. The sensing and output unit 220 is configured substantially the same as a sensing unit 120 and an output unit 130 shown in FIG. 5. Accordingly, the description thereof will not be repeated.

The load selection unit 210 comprises a first load unit 211 and a second load unit 212. The load selection unit 210 changes resistance values of the first and second load units 211 and 212 based on a location of a selected memory cell.

The first load unit 211 is connected to the first memory cell array 201 via a first read bit line RBL1. In some exemplary embodiments the first load unit 211 comprises first and second load transistors ML1 and ML2 connected in parallel with each other. The first and second load transistors ML1 and ML2 may be formed of PMOS transistors. Each of the channels of the first and second load transistors ML1 and ML2 are connected between a bit line of the first memory cell array 201 and an operation voltage source VDD.

The second load unit 212 is connected to the second memory cell array 202 via a second read bit line RBL2. In some exemplary embodiments the second load unit 212 comprises third and fourth load transistors ML3 and ML4 connected in parallel with each other. The third and fourth load transistors ML3 and ML4 may be formed of PMOS transistors. Each of the channels of the third and fourth load transistors ML3 and ML4 are connected between a bit line of the second memory cell array 202 and the operation voltage source VDD.

The first load transistor ML1 of the first load unit 211 operates in response to a first control signal REF1. The fourth load transistor ML4 of the second load unit 212 operates in response to a second control signal REF2. Resistance values of the first and second load units 211 and 212 are varied according to states of the first and fourth load transistors ML1 and ML4. The first and second control signals REF1 and REF2 may be provided in response to an address of a selected memory cell.

Below, the case that a memory cell of the first memory cell array 201 is selected will be described.

The sense amplifier 200 uses a plurality of reference cells of the second memory cell array 202 to read data stored in the selected memory cell of the first memory cell array 201.

The sense amplifier 200 is connected to the selected memory cell of the first memory cell array 201 via the first read bit line RBL1. The sense amplifier 200 is connected to reference cells of the second memory cell array 202 via a second read bit line RBL2. In some exemplary embodiments, the reference cells may include first and second reference cells.

In some exemplary embodiments, the first reference cell is programmed to a first program state. A reference cell having the first program state stores a first bit value. For example, the first bit value may be data '1'. Meanwhile, the second reference cell is programmed to a second program state. A reference cell having the second program state stores a second bit value. For example, the second bit value may be data '0'.

The first and second reference cells are connected in parallel with each other. Thus, a current flowing through the second read bit line RBL2 is decided by a sum of currents respectively flowing through bit lines connected to the first and second reference cells.

In some exemplary embodiments, the first control signal REF1 has a logically high value when a memory cell of the first memory cell array 201 is selected. The first load transistor ML1 is turned off in response to the first control signal REF1. Meanwhile, the second control signal REF2 has a logically low value. The fourth load transistor ML4 is turned on in response to the second control signal REF2. A resistance value of the first load unit 211 is two times larger than that of the second load unit 212 in response to states of the first and fourth load transistors ML1 and ML4. However, it will be appreciated that the resistance value of the first load unit 211 may be a different multiplier than two times larger than the resistance value of the second load unit 212.

As described above, since the sense amplifier compares a selection cell current provided from a selected cell with a reference current provided from the reference cells through the second read bit line RBL2 using the first and second load units 211 and 212, the reliability of a semiconductor memory device 10 (refer to FIG.) is secured and increased.

Below, the case that a memory cell of the second memory cell array 202 is selected will be described.

The sense amplifier 200 uses a plurality of reference cells of the first memory cell array 201 to read data stored in the selected memory cell of the second memory cell array 202.

The sense amplifier 200 is connected to the selected memory cell of the second memory cell array 202 via the second read bit line RBL2. The sense amplifier 200 is connected to reference cells of the first memory cell array 201 via the first read bit line RBL1. In some exemplary embodiments, the reference cells may include first and second reference cells.

In some exemplary embodiments, the first reference cell is programmed to a first program state. A reference cell having the first program state stores a first bit value. For example, the first bit value may be data '1'. Meanwhile, the second reference cell is programmed to a second program state. A reference cell having the second program state stores a second bit value. For example, the second bit value may be data '0'.

The first and second reference cells are connected in parallel with each other. Thus, a current flowing through the first read bit line RBL1 is decided by a sum of currents respectively flowing through bit lines connected to the first and second reference cells.

In some exemplary embodiments, the first control signal REF1 has a logically low value when a memory cell of the second memory cell array 202 is selected. The first load transistor ML1 is turned on in response to the first control signal REF1. Meanwhile, the second control signal REF2 has a logically high value. The fourth load transistor ML4 is turned off in response to the second control signal REF2. A resistance value of the second load unit 212 is two times larger than that of the first load unit 211 in response to states of the first and fourth load transistors ML1 and ML4. However, it will be appreciated that the resistance value of the second load unit 212 may be a different multiplier than two times larger than the resistance value of the first load unit 211.

As described above, a current flowing through bit lines connected to the first and second memory cell arrays 201 and 202 is weighted using the first and second load units 211 and 212 having different resistance values. Since the sense amplifier compares a selection cell current provided from a selected cell with a reference current provided from the reference cells through the first read bit line RBL1 using the first and second load units 211 and 212, the reliability of a semiconductor memory device 10 (refer to FIG.) is secured and increased.

Figure 8:
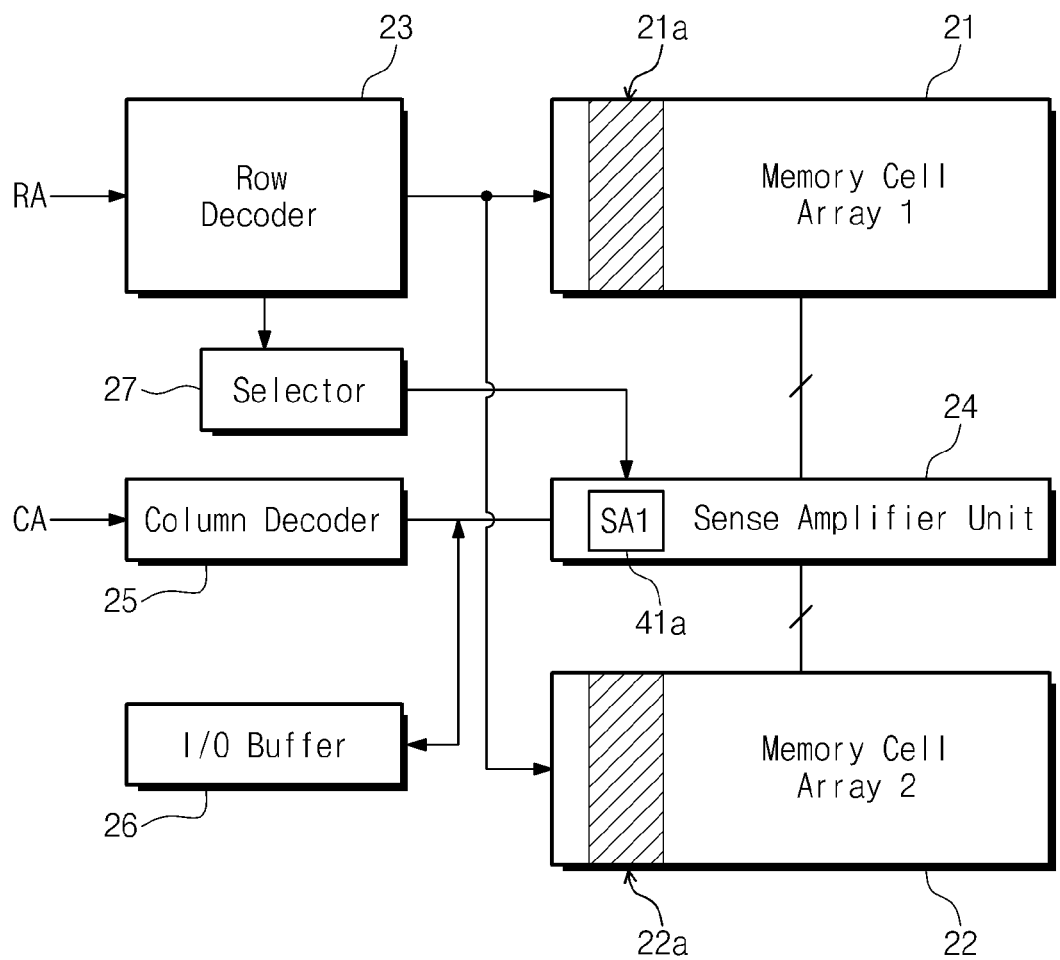
FIG. 8 is a block diagram schematically illustrating a semiconductor memory device according to another exemplary embodiment.

FIG. 8 is a block diagram schematically illustrating a semiconductor memory device according to another exemplary embodiment. Referring to FIG. 8, a semiconductor memory device 20 comprises a first memory cell array 21, a second memory cell array 22, a row decoder 23, a sense amplifier unit 24, a column decoder 25, an input/output (I/O) buffer 26, and a selector 27.

The semiconductor memory device 20 improves a sensing margin using a plurality of reference cells programmed to different program states at a read operation. In addition, the semiconductor memory device 20 comprises a plurality of memory cell arrays. When data is read from a selected memory cell of one memory cell array, the semiconductor memory device 20 uses reference cells included in another memory cell array.

Each of the first and second memory cell arrays 21 and 22 comprises memory cells arranged at intersections of a plurality of word lines and a plurality of bit lines. Also, the first and second memory cell arrays 21 and 22 comprise reference cell areas 21a and 22a, respectively. Each of the reference cell areas 21a and 22a comprises a plurality of reference cells. Reference cells are used to generate a reference voltage or current for reading data stored in a memory cell array. A location of each reference cell area may be fixed within a corresponding memory cell array. Alternatively, a location of each reference cell array may be variable according to a control of an external device or the semiconductor memory device 20.

In some exemplary embodiments, each of the reference cell areas 21a 22a may include two or more reference cells that are programmed to have different program states. The two or more reference cells programmed to have different program states are connected in parallel with each other, and a pair of reference cells may be used to read stored in a selected memory cell.

The row decoder 23 decodes a row address RA provided from an external device. The row address RA may be provided through an address buffer. The row decoder 23 selects a row of the first or second memory cell array 21 or 22 using the decoded row address.

The sense amplifier unit 24 senses and amplifies a voltage or a current developed on a bit line to read data stored in a selected memory cell of the first or second memory cell array 21 or 22. The sense amplifier unit 24 may include a plurality of sense amplifiers respectively connected to the bit lines. In FIG. 8, there is exemplarily illustrated a first sense amplifier SA1 24a.

The first sense amplifier SA1 24a is connected to a selected memory cell and two or more reference cells. The first sense amplifier SA1 24a senses data stored in the selected memory cell using a reference voltage or current generated using the two or more reference cells.

The first sense amplifier SA1 24a is connected to a selected memory cell of the first memory cell array 21 and two or more reference cells of the second memory cell array 22. In some exemplary embodiments, the two or more reference cells share the same bit line.

Meanwhile, the first sense amplifier SA1 24a is connected to two or more reference cells of the first memory cell array 21, and a selected memory cell of the second memory cell array 22. In some exemplary embodiments, the two or more reference cells share the same bit line.

The first sense amplifier SA1 24a adjusts a resistance value of a load unit connected to the first and second memory cells 21 and 22 in response to a control of the selector 27. For example, the first sense amplifier SA1 24a adjusts a resistance value of a load unit connected to a memory cell array including a selected memory cell to have a double resistance value of a load unit connected to a memory cell array including reference cells. Since the first sense amplifier SA1 24a senses data using a reference voltage or current finely controlled using a plurality of reference cells, sensing margin of the semiconductor memory device 20 is improved.

The column decoder 25 decodes a column address CA provided from the external device. The column address may be provided through the address buffer from the external device. The column decoder 25 select a column of the first or second memory cell array 21 or 22 using the decoded column address.

The input/output (I/O) buffer 26 outputs data read from the first or second memory cell array 21 or 22, and provides program data provided from the external device to the first or second memory cell array 21 or 22.

The selector 27 determines a location of a selected memory cell based on a decoded row address provided from the row decoder 23. The selector 27 outputs a control signal for controlling the sense amplifier unit 24 in response to the determination result of the selector 27.

The semiconductor memory device 20 generates a reference voltage or current using a plurality of reference cells that are programmed to have different program states. The sense amplifier 24 reads data of a selected memory cell of a memory cell array using reference cells of another memory cell array, under the control of the selector 27. Since the semiconductor memory device 20 senses stored data using a reference voltage or current finely controlled using a plurality of reference cells, sensing margin of the semiconductor memory device 20 is improved.

Figure 9:
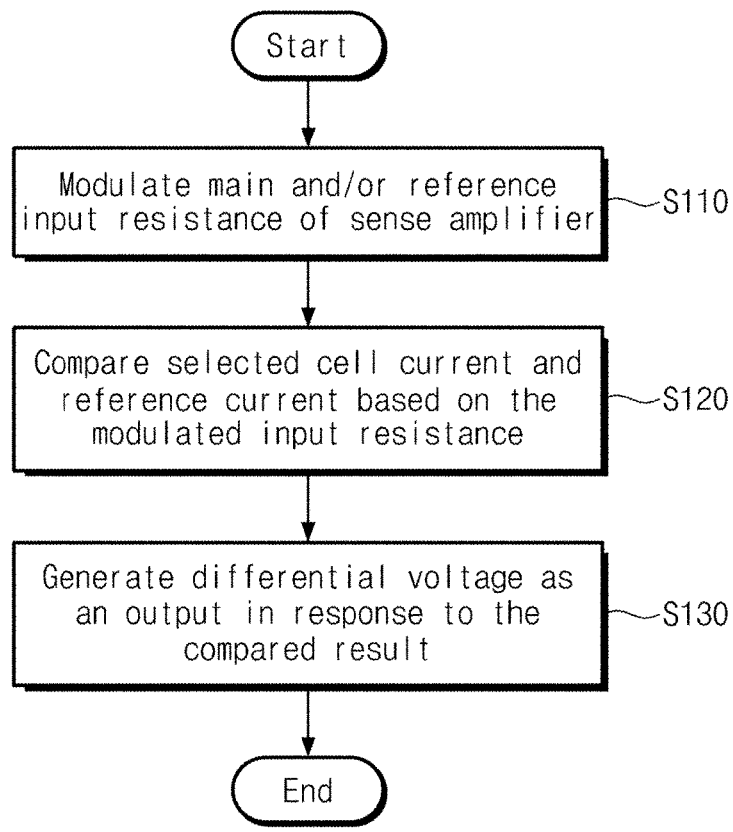
FIG. 9 is a flow chart schematically illustrating a read method of a semiconductor memory device according to an exemplary embodiment.

FIG. 9 is a flow chart schematically illustrating a read method of a semiconductor memory device according to an exemplary embodiment.

In operation S110, a main and/or reference input resistance value of a sense amplifier is modulated. The main input resistance value of the sense amplifier is connected to a selected memory cell via a read bit line. The reference resistance value is connected to parallel-connected reference cells via a reference read bit line. The main and reference input resistance values of the sense amplifier are adjusted to have a ratio based on a sum of currents flowing through reference cells connected to the reference read bit line. The ratio may be predetermined.

In some exemplary embodiments, the reference cells comprise first and second reference cells. For example, the first reference cell is programmed to a first program state. A reference cell having the first program state stores a first bit value. The first bit value may be data '1'. The second reference cell is programmed to a second program state. A reference cell having the second program state stores a second bit value. The second bit value may be data '0'. The main and reference input resistance values are adjusted to have a ratio of 2:1.

In the event that a memory cell array including a selected memory cell is different from a memory cell array including reference cells, the sense amplifier adjusts the main and/or reference input resistance value in response to a control signal indicating a location of the selected memory cell.

In operation S120, a selection cell current provided through a read bit line is compared with a reference current provided through a reference read bit line. The selection cell current and the reference current are compared under the condition that the selection cell current and the reference current are corrected with a weight in response to a ratio of the main input resistance value to the reference input resistance value. The weight may be predetermined.

In operation S130, a differential voltage is generated as an output according to a difference between the selection cell current and the reference current compared in operation S120.

With the above-described read method, since a semiconductor memory device senses stored data using a reference voltage or current finely controlled using a plurality of reference cells, sensing margin of the semiconductor memory device is improved.

Figure 10:
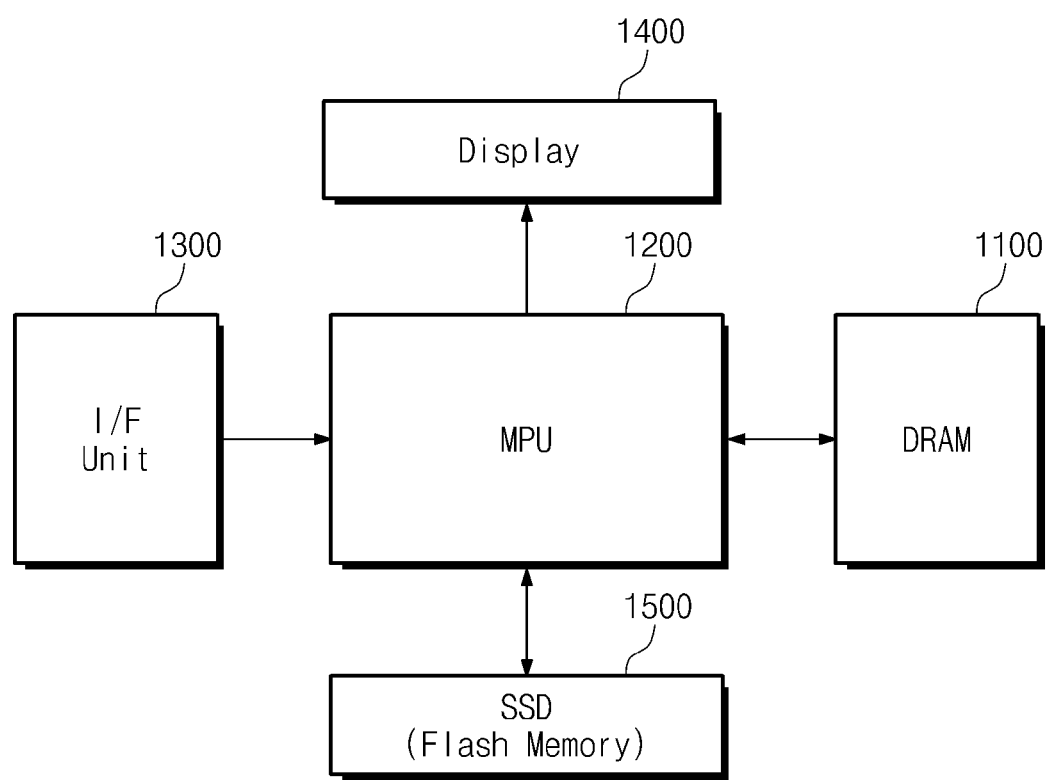
FIG. 10 is a block diagram schematically illustrating application of exemplary embodiments in a mobile device.

FIG. 10 is a block diagram schematically illustrating application of exemplary embodiments in a mobile device.

Referring to FIG. 10, a mobile device may be a notebook computer or a handheld electronic device, and includes a DRAM 1100, a micro processing unit (MPU) 1200, an interface (I/F) unit 1300, a display 1400, and a solid state drive (SSD) 1500. The SSD 1500 may be a flash memory.

In some cases, the DRAM 1100, the MPU 1200, and the SSD 1300 are provided in the form of a package or integrated into a chip. This may denote that the DRAM 1100 and the SSD 1500 are embedded in the mobile device.

If the mobile device is a portable communications device, the interface (I/F) unit 1300 is connected to a modem and transceiver block which is configured to perform a communication data transmitting and receiving function and a data modulating and demodulating function.

The DRAM 1100 is connected to the MPU 1200, and acts as a buffer memory or a main memory of the MPU 1200. Like a semiconductor memory device shown in FIG. 1, the DRAM 1100 may comprise a plurality of reference cells programmed to different program states. Also, the DRAM 1100 may comprise an unbalanced sense amplifier according to one or more of the above described exemplary embodiments for comparing a reference current provided from the reference cells and a selection cell current provided from a selected memory cell. Since the DRAM 1100 senses data using a reference voltage or current finely controlled via the reference cells, sensing margin is improved.

The MPU 1200 controls an overall operation of the mobile device according to a given program.

The display 1400 may be a liquid crystal having a backlight, a liquid crystal having an LED light source, or a touch screen (e.g., OLED). The display 1400 is used as an output device for displaying images (e.g., characters, numbers, pictures, etc.) in color.

The SSD 1500 includes a NOR or NAND flash memory. In FIG. 10, there is illustrated an example in which an SSD is used as a storage device of FIG. 10. However, a variety of nonvolatile storages may be used. The nonvolatile storage may store data information having various data formats such as a text, a graphic, a software code, etc.

In some exemplary embodiments, the nonvolatile storage may be formed of an EEPROM (Electrically Erasable Programmable Read-Only Memory), a flash memory, an MRAM (Magnetic RAM), a STT-MRAM (Spin-Transfer Torque MRAM), a CBRAM (Conductive bridging RAM), a FeRAM (Ferroelectric RAM), a PRAM (Phase change RAM) called OUM (Ovonic Unified Memory), an RRAM or ReRAM (Resistive RAM), a nanotube RRAM, a PoRAM (Polymer RAM), NFGM (Nano Floating Gate Memory), a holographic memory, a molecular electronics memory device), or an insulator resistance change memory, etc There is described an example in which the mobile device is a mobile communications device. In some cases, the mobile device functions as a smart card by adding or removing components to or from the mobile device.

In case of the mobile device, a separate interface is connected to an external communications device. The communications device may be a DVD player, a computer, a set top box (STB), a game machine, a digital camcorder, or the like.

In some exemplary embodiments, the mobile device may further include an application chipset, a camera image processor (CIS), a mobile DRAM, etc.

Chips forming the mobile device may be packed using various packages such as a PoP (Package on Package), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline Integrated Circuit (SOIC), a Shrink Small Outline Package (SSOP), a Thin Small Outline Package (TSOP), a System In Package (SIP), a Multi Chip Package (MCP), a Wafer-level Fabricated Package (WFP), a Wafer-Level Processed Stack Package (WSP), etc.

Figure 11:
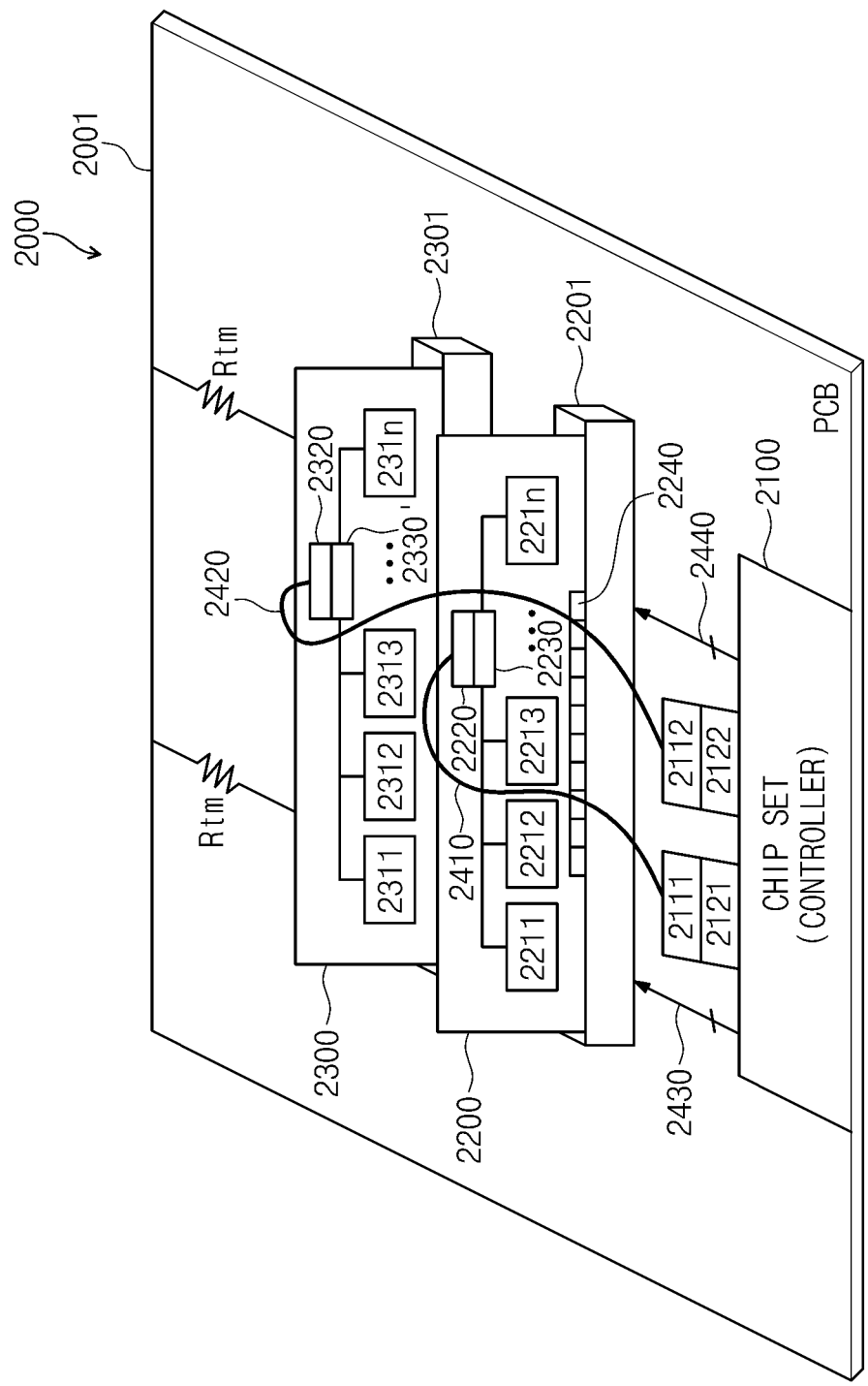
FIG. 11 is a block diagram schematically illustrating an application of the exemplary embodiments in an optical I/O scheme.

FIG. 11 is a block diagram schematically illustrating an application of exemplary embodiments in an optical I/O scheme.

Referring to FIG. 11, a memory system 2000 adopting a high-speed optical input/output scheme includes a chipset 2100 as a controller, and memory modules 2200 and 2300 mounted on a PCB substrate 2001. The memory modules 2200 and 2300 are inserted in slots 2201 and 2301 installed on the PCB substrate 2001. The memory modules 2200 and 2300 are configured the same, and the inventive concepts are described using the memory module 2200.

The memory module 2200 includes DRAM memory chips 2211 to 221n, an optical I/O input unit 2220, an optical I/O output unit 2230, and a connector 2240.

The optical I/O input unit 2220 includes a photoelectric conversion element (e.g., a photodiode) to convert an input optical signal into an electrical signal. The electrical signal output from the photoelectric conversion element is received by the memory module 2200.

The optical I/O output unit 2230 includes an electrophotic conversion element (e.g., a laser diode) to convert an electrical signal output from the memory module 2200 into an optical signal. In some cases, the optical I/O output unit 2230 further includes an optical modulator to modulate a signal output from a light source.

An optical cable 2410 performs a role of optical communications between the optical I/O input unit 2220 of the memory module 2200 and an optical transmission unit 2111 of the chipset 2100. The optical communications may have a bandwidth (e.g., more than score gigabits per second). The memory module 2200 receives signals or data from signal lines 2430 and 2440 of the chipset 2100 through the connector 2240, and performs high-speed data communications with the chipset 2100 through the optical cable 2410. Meanwhile, resistors Rtm are termination resistors.

The DRAM memory chips 2211 to 221n according to one or more exemplary embodiments may be applied to the memory system 2000 with the optical I/O structure shown in FIG. 11.

As described with reference to a semiconductor memory device shown in FIG. 1, each of the DRAM memory chips 2211 to 221n in the memory system 2000 may comprise a plurality of reference cells programmed to different program states. Also, each of the DRAM memory chips 2211 to 221n may comprise an unbalanced sense amplifier according to one or more of the above described exemplary embodiments for comparing a reference current provided from the reference cells and a selection cell current provided from a selected memory cell. Since each of the DRAM memory chips 2211 to 221n senses data using a reference voltage or current finely controlled via the reference cells, sensing margin is improved.

In the case that the memory system of FIG. 11 is an SSD, the DRAM memory chips 2211 to 221n may be used as a user data buffer.

Figure 12:
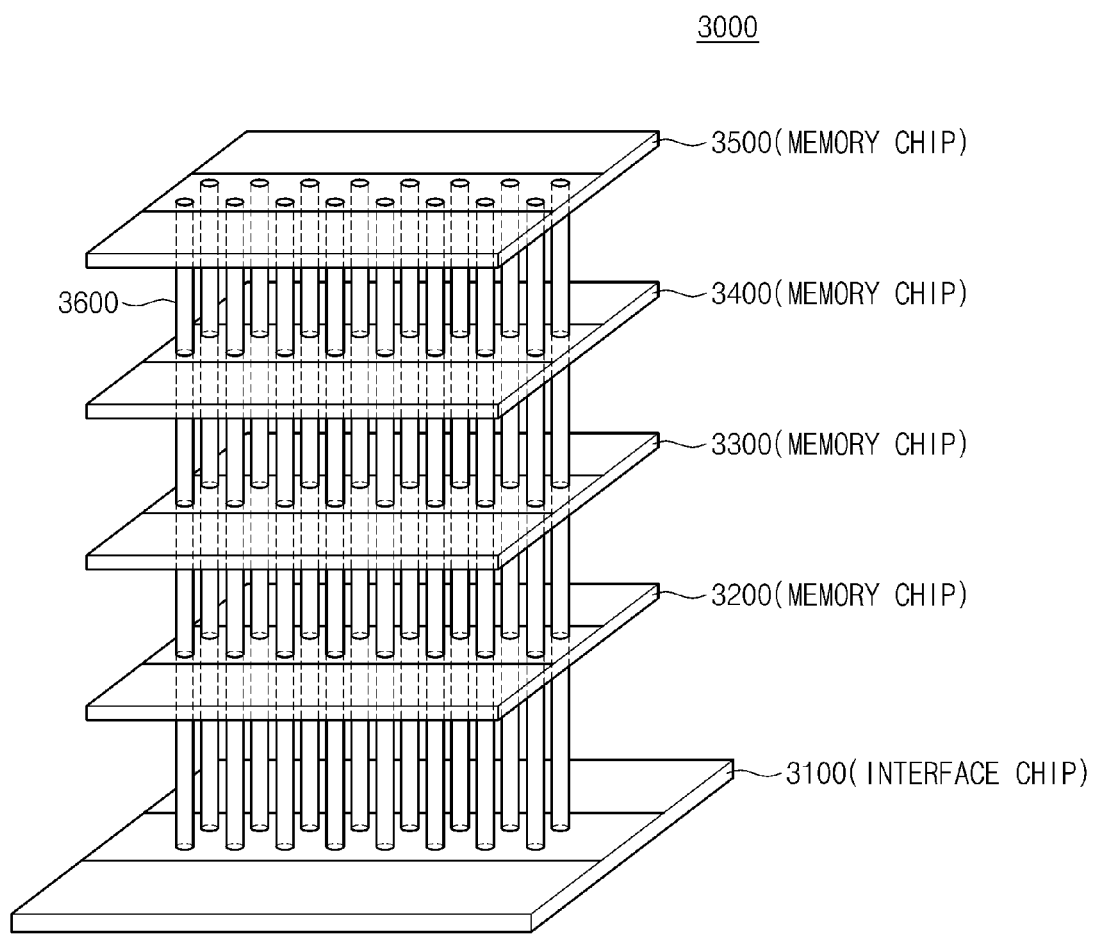
FIG. 12 is a diagram schematically illustrating an application of the exemplary embodiments in through-silicon via (TSV)

FIG. 12 is a diagram schematically illustrating an application of exemplary embodiments in a through-silicon via (TSV).

Referring to a stack type memory device 3000 in FIG. 12, a plurality of memory chips 3200 to 3500 is stacked on an interface chip 3100 in a vertical direction. Herein, a plurality of through-silicon vias 3600 is formed to penetrate the memory chips 3200 to 3500. Mass data is stored in the three-dimensional stack package type memory device 3000 including the memory chips 3200 to 3500 stacked on the interface chip 3100 in a vertical direction. Also, the three-dimensional stack package type memory device 3000 is advantageous for high speed, low power and scale-down.

The stack type memory device shown in FIG. 12 may comprise DRAMs according to one or more exemplary embodiments. As described with reference to a semiconductor memory device shown in FIG. 1, thus, a DRAM forming the memory chips 3200 to 3500 may comprise a plurality of reference cells programmed to different program states. Also, the DRAM may comprise an unbalanced sense amplifier according to one or more of the above described exemplary embodiments for comparing a reference current provided from the reference cells and a selection cell current provided from a selected memory cell. Since the DRAM senses data using a reference voltage or current finely controlled via the reference cells, sensing margin is improved.

Figure 13:
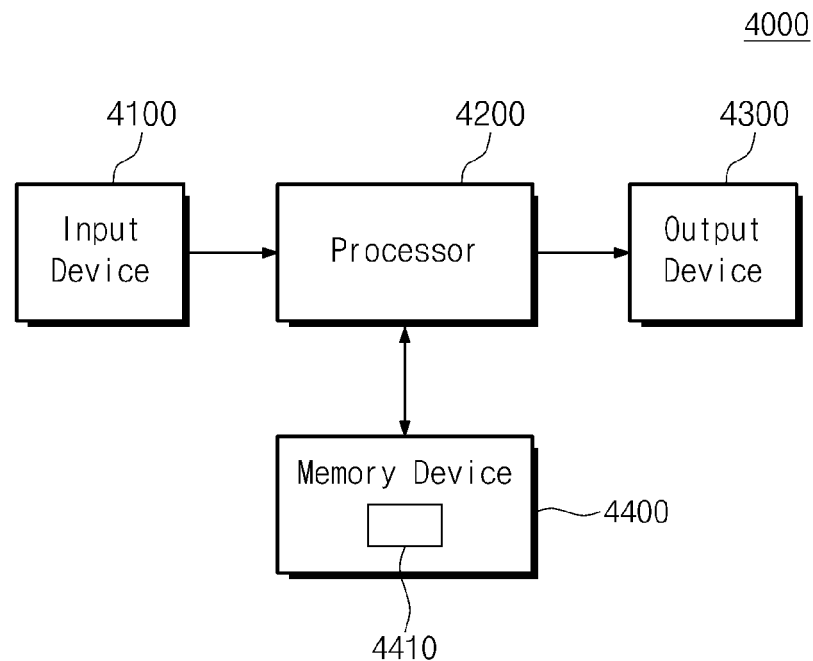
FIG. 13 is a block diagram schematically illustrating an application of the exemplary embodiments in an electronic system

FIG. 13 is a block diagram schematically illustrating an application of exemplary embodiments in an electronic system. As illustrated in FIG. 13, an electronic system 4000 includes an input device 4100, a processor 4200, an output device 4300, and a memory device 4400. The memory device 4400 includes a DRAM 4410 that is configured substantially the same as that shown in FIG. 1. Also, note that the DRAM 4410 is integrated in one of the input device 4100, the processor 4200, and the output device 4300.

As described with reference to a semiconductor memory device shown in FIG. 1, the DRAM 4410 may comprise a plurality of reference cells programmed to different program states. Also, the DRAM 4410 may comprise an unbalanced sense amplifier according to one or more of the above described exemplary embodiments for comparing a reference current provided from the reference cells and a selection cell current provided from a selected memory cell. Since the DRAM 4410 senses data using a reference voltage or current finely controlled via the reference cells, sensing margin is improved.

Figure 14:
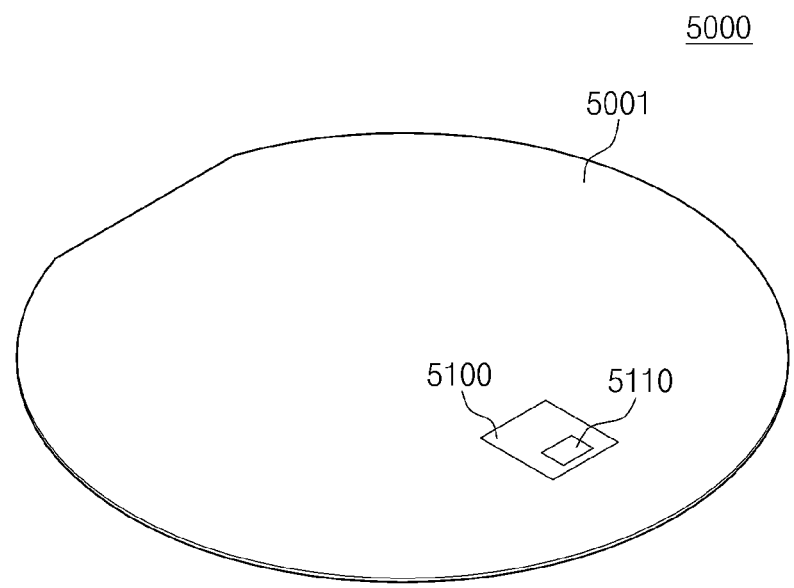
FIG. 14 is a diagram schematically illustrating a semiconductor wafer according to an exemplary embodiment.

FIG. 14 is a diagram schematically illustrating a semiconductor wafer according to an exemplary embodiment.

Referring to FIG. 14, a memory device 5100 (e.g., DRAM) including another circuit component 5110 is fabricated on a semiconductor wafer 5001. It is well understood that the memory device 5100 is fabricated on a variety of semiconductor substrates.

As described with reference to a semiconductor memory device shown in FIG. 1, the memory device 5100 forming the memory chips 3200 to 3500 may comprise a plurality of reference cells programmed to different program states. Also, the memory device 5100 may comprise an unbalanced sense amplifier according to one or more of the above described exemplary embodiments for comparing a reference current provided from the reference cells and a selection cell current provided from a selected memory cell. Since the memory device 5100 senses data using a reference voltage or current finely controlled via the reference cells, sensing margin is improved.

Figure 15:
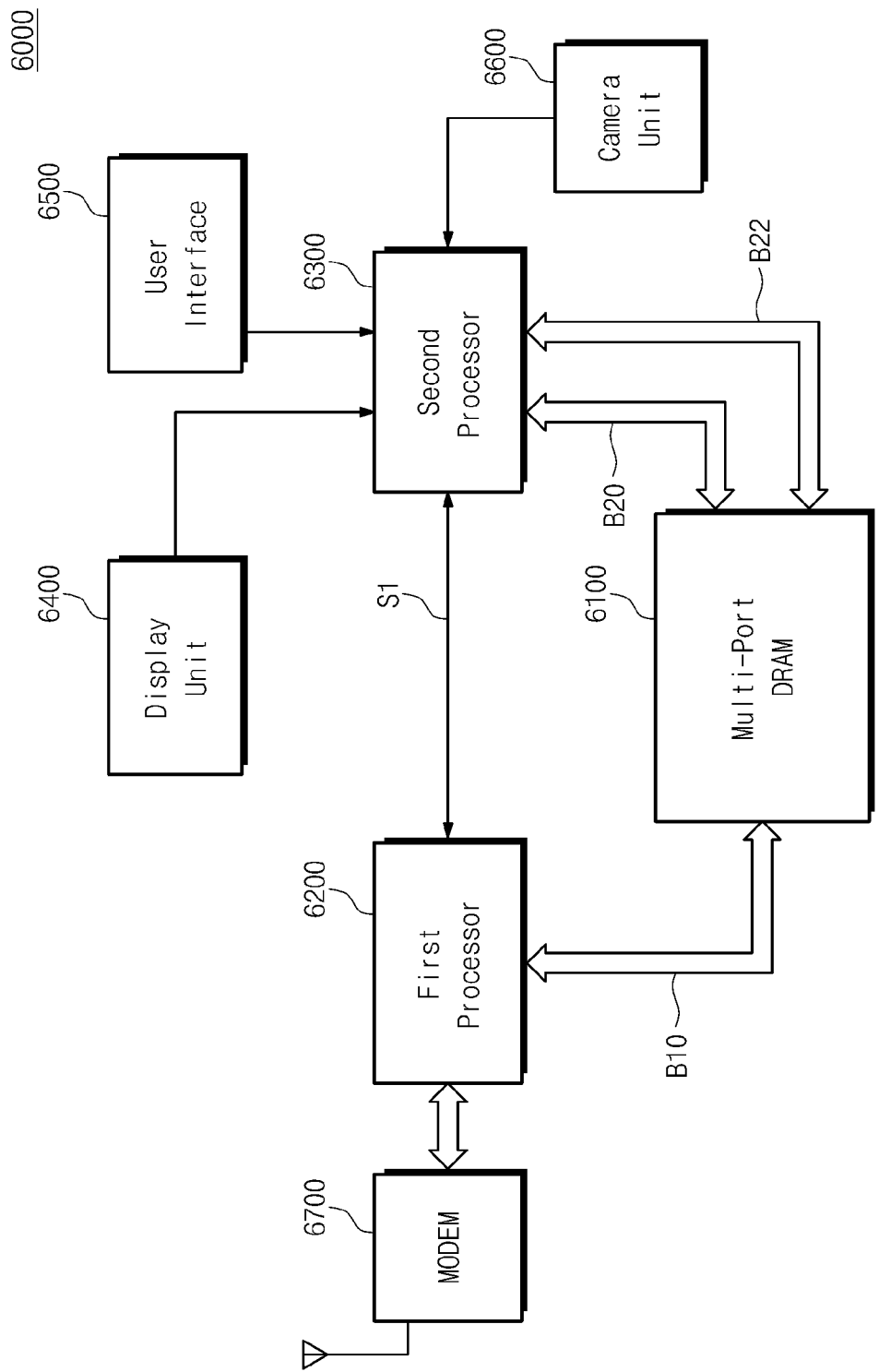
FIG. 15 is a block diagram schematically illustrating an application of the exemplary embodiments in a portable device.

FIG. 15 is a block diagram schematically illustrating an application of exemplary embodiments in a portable device.

Referring to FIG. 15, a portable device functions as a smart phone and includes a multi-port DRAM 6100, a first processor 6200, a second processor 6300, a display unit 6400, a user interface 6500, a camera unit 6600, and a modem 6700.

The multi-port DRAM 6100 has three ports respectively connected to first to third buses B10, B20, and B22, and is connected to the first and second processors 6200 and 6300. The first port of the multi-port DRAM 6100 is connected to the first processor 6200 (e.g., a baseband processor) through the first bus B10. The second port of the multi-port DRAM 6100 is connected to the second processor 6300 (e.g., an application processor) through the second bus B20. The third port of the multi-port DRAM 6100 is connected to the second processor 6300 through the third bus B22.

In some exemplary embodiments, the multi-port DRAM 6100 replaces a storage memory and two DRAMs. Also, the multi-port DRAM 6100 has three ports and plays roles of a DRAM and a flash memory. In this case, the multi-port DRAM 6100 operates using a DRAM interface, so that it replaces two DRAMs. The multi-port DRAM 6100 may have an operation range and an operation voltage that SDRAM DDR4 requires.

As described with reference to a semiconductor memory device shown in FIG. 1, the multi-port DRAM 6100 may comprise a plurality of reference cells programmed to different program states. Also, the multi-port DRAM 6100 may comprise an unbalanced sense amplifier according to one or more of the above described exemplary embodiments for comparing a reference current provided from the reference cells and a selection cell current provided from a selected memory cell. Since the multi-port DRAM 6100 senses data using a reference voltage or current finely controlled via the reference cells, sensing margin is improved.

An interface of the first bus B10 may be a volatile memory interface, and the first port may receive first packet data generated from the first processor 6200 to transfer the first packet data to an internal circuit block of the multi-port DRAM 6100. Also, the first port may provide first data of the multi-port DRAM 6100 to the first processor 6200. In this case, the first data may be parallel data.

An interface of the third bus B22 may be a volatile memory interface, and the third port may receive third packet data generated from the second processor 6300 to transfer the third packet data to an internal circuit block of the multi-port DRAM 6100. Also, the third port may provide third data of the multi-port DRAM 6100 to the second processor 6300.

An interface of the second bus B20 may be a nonvolatile memory (e.g., NAND flash) interface, and the second port may receive second packet data generated from the second processor 6300 to transfer the second packet data to an internal circuit block of the multi-port DRAM 6100. Also, the second port may provide second data of the multi-port DRAM 6100 to the second processor 6300. In this case, the second data may be serial data or parallel data.

An interface of the buses may be one of interface protocols such as a USB (Universal Serial Bus), a MMC (Multi-Media Card), a PCIE (Peripheral Component Interconnect-Express), a SAS (Serial-attached SCSI), a SATA (Serial Advanced Technology Attachment), a PATA (Parallel Advanced Technology Attachment), a SCSI (Small Computer System Interface), an ESDI (Enhanced Small Disk Interface), and an IDE (Integrated Drive Electronics).

In some cases, the first and second processors 6200 and 6300 and the multi-port DRAM 6100 may be integrated to a chip or packaged. In this case, the multi-port DRAM 6100 may be embedded in the mobile device.

In the event that the portable device is a smart phone, the first processor 6200 is connected to the modem 6700 that transmits and receives communications data and modulates and demodulates data.

A NOR or NAND flash memory may be additionally connected to the first processor 6200 or the second processor 6300 to store mass information.

The display unit 6400 may have a liquid crystal having a backlight, a liquid crystal having an LED light source, or a touch screen (e.g., OLED). The display unit 6400 may be an output device for displaying images (e.g., characters, numbers, pictures, etc.) in color.

There is described an example in which the portable device 6000 is a smart phone. In some cases, the portable device may be used as a smart card by adding or removing components.

The portable device may be connected to an external communications device through a separate interface. The communications device may be a DVD player, a computer, a set top box (STB), a game machine, a digital camcorder, or the like.

The camera unit 6600 may include a camera image processor (CIS), and may be connected to the second processor 6300.

Although not shown in FIG. 15, the portable device 6000 may further include an application chipset, a camera image processor (CIS), a mobile DRAM, and so on.

In FIG. 15, there is illustrated an example in which a DRAM is installed at the portable device as a multi-port volatile memory. However, a variety of nonvolatile memories may be used instead of the multi-port volatile memory.

While the inventive concept has been described with reference to exemplary embodiments, it will be apparent to those skilled in the art that various changes and modifications may be made without departing from the spirit and scope of the present inventive concept. Therefore, it should be understood that the above exemplary embodiments are not limiting, but illustrative. For example, various changes and modifications of a sense amplifier may be made without departing from the spirit and scope of the present inventive concept.

What is claimed is:
1. A sense amplifier comprising:
a first load supplied with a first cell current from a first read bit line connected to a first memory cell array;
a second load supplied with a second cell current from a second read bit line connected to a second memory cell array; and
a sensing unit configured to correct a level of the second cell current based on a resistance ratio of the first and second loads and to compare the first cell current and the corrected second cell current, wherein resistance values of the first and second loads are varied in response to a control signal, and wherein the second load comprises a plurality of transistors, channels of the plurality of transistors being connected between an operation voltage source and the second read bit line.

2. The sense amplifier of claim 1, wherein the first and second loads comprise MOS transistors.

3. The sense amplifier of claim 2, wherein the first load comprises first and second transistors, channels of the first and second transistors being connected between the operation voltage source and the first read bit line, and wherein the first transistor is turned on in response to the control signal.

4. The sense amplifier of claim 3, wherein the second load comprises third and fourth transistors, channels of the third and fourth transistors being connected between the operation voltage source and the second read bit line, and wherein the fourth transistor is turned off in response to the control signal.

5. A semiconductor memory device comprising:
a first memory cell array comprising a first main cell area and a first reference cell area sharing a first word line with the first main cell area;
a second memory cell array comprising a second main cell area and a second reference cell area sharing a second word line with the second main cell area;
a sense amplifier connected to the first memory cell array via a first bit line to be supplied with a first cell current, connected to the second memory cell array via a second bit line to be supplied with a second cell current, and configured to sense data stored in the first and second main cell areas using the second and first reference cell areas, respectively; and
a selector configured to provide the sense amplifier with a control signal indicating a location of a selected memory cell,
wherein the sense amplifier is further configured to correct levels of the first and second cell currents in response to the control signal, to compare the corrected first and second cell currents, and to sense the data stored in the first and second main cell areas based on the compared result.

6. The semiconductor memory device of claim 5, wherein when a memory cell of the first memory cell array is selected, the sense amplifier is connected to the first main cell area and the second reference cell area to sense the data stored in the first main cell area using the second reference cell area.

7. The semiconductor memory device of claim 6, wherein the second reference cell area comprises first and second reference cells sharing the second bit line, wherein the first reference cell is programmed to a first program state for storing a first bit value, and wherein the second reference cell is programmed to a second program state for storing a second bit value.

8. The semiconductor memory device of claim 7, wherein the first bit value corresponds to data '1' and the second bit value corresponds to data '0'.

9. The semiconductor memory device of claim 5, wherein the first and second reference cell areas are set in response to a signal provided from an external device.

10. The semiconductor memory device of claim 5, wherein locations of the first and second reference cell areas are fixed within the first and second memory cell arrays, respectively.

11. The semiconductor memory device of claim 5, wherein the selector is further configured to generate the control signal in response to an address signal provided from an external device.

12. The semiconductor memory device of claim 11, further comprising:
a row decoder configured to decode a row address provided from the external device,
wherein the selector is further configured to generate the control signal based on the row address.

13. The semiconductor memory device of claim 5, wherein the first and second memory cell arrays comprise a plurality of memory cells each having a gain cell structure.

14. An unbalanced sense amplifier comprising:
a load unit comprising a main load connected to a read bit line, and a reference load connected to a reference read bit line, the main load and the reference load being unbalanced; and
a sensing unit configured to sense a first voltage drop across the main load and a second voltage drop across the reference load, and to amplify a voltage difference between the first and second voltage drops,
wherein the sensing unit adjusts a resistance value of the main load, and a resistance value of the reference load in response to a control signal, the adjustment performed in accordance with a weighting.

15. The unbalanced sense amplifier of claim 14, wherein the main load comprises a load transistor, and the reference load comprises two reference load transistors.

* * * * *